(12) United States Patent
Bruchhaus et al.

(10) Patent No.: US 6,704,219 B2
(45) Date of Patent: Mar. 9, 2004

(54) FERAM MEMORY AND METHOD FOR MANUFACTURING IT

(75) Inventors: Rainer Bruchhaus, Kanagawa-Pref (JP); Gerhard Enders, Olching (DE); Walter Hartner, Glen Allen, VA (US); Matthias Krönke, Dresden (DE); Thomas Mikolajick, München (DE); Nicolas Nagel, Naka-Ku Yokohama (JP); Michael Röhner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/186,645

(22) Filed: Jul. 1, 2002

(65) Prior Publication Data

US 2003/0053346 A1 Mar. 20, 2003

(30) Foreign Application Priority Data

Jun. 29, 2001 (DE) .......................... 101 31 625

(51) Int. Cl.[7] .............................................. G11C 11/22
(52) U.S. Cl. .................. 365/145; 365/149; 365/173
(58) Field of Search ................... 365/145, 149, 365/117, 173

(56) References Cited

U.S. PATENT DOCUMENTS

| | | | | |
|---|---|---|---|---|
| 5,247,196 A | * | 9/1993 | Kimura | 257/303 |
| 5,689,456 A | * | 11/1997 | Kobayashi | 365/145 |
| 6,028,784 A | * | 2/2000 | Mori et al. | 365/145 |
| 6,190,964 B1 | * | 2/2001 | Winters | 438/254 |
| 6,291,250 B1 | * | 9/2001 | Igarashi | 438/3 |
| 6,441,415 B1 | * | 8/2002 | Moise et al. | 257/295 |
| 6,583,495 B2 | * | 6/2003 | Lee et al. | 257/595 |

FOREIGN PATENT DOCUMENTS

| | | |
|---|---|---|
| DE | 41 09 299 A1 | 10/1991 |
| DE | 44 30 771 A1 | 3/1995 |
| DE | 198 32 095 C1 | 3/2000 |

OTHER PUBLICATIONS

Takashima, D. et al.: "High Density Chain Ferroelectric Random Access Memory (Chain FRAM)", IEEE, vol. 33, No. 5, May, 1998, pp. 787–792.

* cited by examiner

Primary Examiner—Michael S. Lebentritt
Assistant Examiner—Hien Nguyen
(74) Attorney, Agent, or Firm—Laurence A. Greenberg; Werner H. Stemer; Ralph E. Locher

(57) ABSTRACT

To manufacture FeRAM memories in a particularly space-saving fashion and, thus, increase the storage density, a manufacturing method forms at least some of the multiplicity of capacitor devices used as storage elements with a multiplicity of individual capacitors that are connected in parallel with one another. The individual capacitors have ferroelectric or paraelectric dielectric regions with different coercive voltages such that there is a resulting multiplicity of storage states for each of the individual capacitors.

36 Claims, 12 Drawing Sheets

FERAM MEMORY AND METHOD FOR MANUFACTURING IT

BACKGROUND OF THE INVENTION

Field of the invention

The invention relates to a FeRAM memory and a method for manufacturing it.

When modern semiconductor memory devices are manufactured, in particular, when FeRAM memories or the like are manufactured, a semiconductor substrate or the like, a passivation region and/or a surface region thereof are formed with a CMOS structure that forms the underlying circuit configuration of the semiconductor memory device. A capacitor configuration with a multiplicity of capacitor devices that are used as storage elements is formed in the region of the semiconductor substrate or the like, a passivation region and/or a surface region thereof.

In such prior art manufacturing methods, an objective is to realize an integration density that is as high and wide-ranging as possible during the processing of the corresponding semiconductor memories.

Conventional semiconductor memory devices that use capacitor devices as storage elements are limited with respect to the integration density to the extent that the capacitor devices used for their method of functioning as storage capacitors or storage elements must not drop below a certain minimum size, and, thus, a minimum extent. Therefore, even with the minimum space in between conventional capacitor devices, there is automatically a limit on the surface density of storage elements, which cannot be undershot.

SUMMARY OF THE INVENTION

It is accordingly an object of the invention to provide a FeRAM memory and method for manufacturing a FeRAM memory that overcome the hereinafore-mentioned disadvantages of the heretofore-known devices and methods of this general type and that achieves a particularly high storage density with simultaneous functional reliability.

With the foregoing and other objects in view, there is provided, in accordance with the invention, a FeRAM memory, including at least one of a semiconductor substrate, a passivation region and a surface region formed with a CMOS structure, and a capacitor configuration having a multiplicity of capacitor devices used as storage elements disposed in a region of the at least one of the semiconductor substrate, the passivation region, and the surface region, at least some of the capacitor devices being formed with a multiplicity of individual capacitors connected in parallel with one another, the individual capacitors having one of ferroelectric and paraelectric dielectric regions with different coercitive voltages to provide each of the capacitor devices with a multiplicity of storage states.

In the FeRAM memory according to the invention, a semiconductor substrate, a passivation region, and/or a surface region thereof are formed with a CMOS structure. In the region of the semiconductor substrate, the passivation region and/or the surface region, a capacitor configuration of a multiplicity of capacitor devices that are used as storage elements is formed. At least some of the capacitor devices are formed with a multiplicity of individual capacitors that are connected in parallel with one another. The individual capacitors are formed with ferroelectric or paraelectric dielectric regions with different coercitive voltages, resulting in a multiplicity of storage states with each capacitor device.

A first electrode device, a second electrode device, and a dielectric provided between them are advantageously formed for each capacitor device.

It is also advantageous that at least some of the first and/or second electrode devices are formed with a multiplicity of electrodes that are respectively electrically connected to one another, and that, as a result, a multiplicity of individual capacitors that are connected in parallel with one another are formed.

It is also advantageous that at least some of the respective multiplicity of electrodes that are connected to one another are identified with one another, in particular, as an electrically conductive one-part or one-piece region.

In accordance with another feature of the invention, at least some of the capacitor devices are in contact by their respective first electrode device, through a first contact element, with the first electrode device of a first directly spatially adjacent capacitor device, and by a second electrode device, through a second contact element, with the second electrode device of a second directly spatially adjacent capacitor device of the capacitor configuration, to form a capacitor configuration with at least a partially connected or chain structure. It is also advantageous that at least some of the capacitor devices are constructed in the form of a stack structure.

With the objects of the invention in view, there is also provided a method for manufacturing a FeRAM memory, the steps of forming at least one of a semiconductor substrate, a passivation region, and a surface region with a CMOS structure, and forming a capacitor configuration of a multiplicity of capacitor devices used as storage elements in a region of the at least one of the semiconductor substrate, the passivation region, and the surface region, at least some of the capacitor devices being formed with a multiplicity of individual capacitors connected in parallel with one another, the individual capacitors being formed with one of ferroelectric and paraelectric dielectric regions with different coercitive voltages, and, as a result, each capacitor device is formed with a multiplicity of storage states.

In comparison with the method mentioned at the beginning for manufacturing a semiconductor memory device, and, in particular, a FeRAM memory or the like, the method-related solution according to the invention is further defined in that at least some of the capacitor devices are formed with a multiplicity of individual capacitors that are connected in parallel with one another. The individual capacitors are formed with ferroelectric or paraelectric dielectric regions with different coercitive voltages, resulting in a multiplicity of storage states in each capacitor device.

A fundamental aspect of the present invention is, thus, to form, instead of a single individual capacitor with electrode devices, opposite one another, for each capacitor device that is to serve as a storage element, a multiplicity of individual capacitors that are substantially connected in parallel. Using a multiplicity of individual capacitors for each capacitor device provides the possibility of a flexible configuration of these individual capacitors so that it is possible specifically to take account of the aspect of increasing the integration density. Thus, the individual capacitors of the capacitor devices can be formed and disposed such that while the function is still reliable, a minimum amount of space is required in the storage element. The minimum capacity that is necessary overall for the method of functioning is, thus, distributed in terms of areas over the multiplicity of individual capacitors that are connected in parallel.

A first electrode device, a second electrode device, and a dielectric that is substantially formed between them are provided for each of the capacitor devices.

To realize the multiplicity of individual capacitors, there is provision, in accordance with a further mode of the invention, at least a part of the first and/or second electrode device is formed with a multiplicity of electrodes that are respectively electrically connected to one another to form the multiplicity of individual capacitors that are connected in parallel with one another.

In accordance with an added mode of the invention, for manufacturing a semiconductor memory device according to the invention, at least some of the respective multiplicity of electrodes that are connected to one another are formed so that they are identified with one another, in particular, as an electrically conductive one-part and/or one-piece region or the like. Thus, it is possible, for example, advantageously to provide that one and the same electrically conductive region forms, with one surface area, one electrode, and with another surface area, another electrode of the multiplicity of individual capacitors or a given capacitor device. If, for example, a planar metallization region is provided, the surface regions of the front and rear sides of the upper and lower sides of this one metallization region can form the respective plurality of electrodes.

In addition to the saving in space as a result of the particularly flexible way in that the multiplicity of individual capacitors can be disposed for each capacitor device, a further increase in the integration density is obtained if at least some of the capacitor devices of the capacitor configuration are formed with a connected or chain structure. This can be achieved, for example, by virtue of the fact that at least some of the capacitor devices are placed in contact by their respective first electrode device, through a first contact element, with the first electrode device of a first substantially directly spatially adjacent capacitor device, and by their second electrode device, through a second contact element, with the second electrode device of a second substantially directly spatially adjacent capacitor device of the capacitor configuration.

A further increase in the integration density is obtained if at least some of the capacitor devices are constructed substantially in the form of a stack structure.

In detail, the following procedure can be adopted when manufacturing the structure according to the invention.

There is provision that the, in particular, substantially horizontally extending semiconductor substrate or the like and/or a surface region thereof, and, in particular, the CMOS structure, are at least partially covered and/or embedded by at least one first passivation region that extends substantially at the top and/or substantially laterally and is composed of a substantially electrically insulating material. This takes place advantageously in a substantially two-dimensional, conformal fashion so as to cover a large area and/or the entire area, and, in particular, it is also possible to form a substantially planar surface region.

To form corresponding contacts between the capacitor devices that are used as storage elements and the underlying CMOS structure, first cutouts are preferably firstly formed in defined first and second regions or defined first and second locations in the upper first passivation region, in particular, by a preferably selective and/or common etching process or the like.

Here, selector transistor devices of the underlying CMOS structure that are provided substantially above source/drain regions in the surface region of the semiconductor substrate can be selected as defined first and second regions and/or as defined first and second locations and regions.

Here, the first and second cutouts are advantageously formed vertically at least to a certain extent as far as the level of the surface regions of the source-drain regions of the selector transistor devices.

A first material region of a substantially electrically conductive material is then advantageously formed and/or deposited to form first and second contact regions and/or plug regions in order to form contact between the capacitor devices and the underlying CMOS structure. This takes place, in particular, in a two-dimensional, conformal fashion over a large area and/or over the entire area, in particular, the first and second cutouts being also each filled as far as the level of the surface region of the source/drain regions. Furthermore, in particular, a polishing method with a stop at the level of the surface regions of the first passivation region can take place.

By such a procedure, first and second contact regions or plug regions, which extend from the surface region of the source/drain region and of the selector transistor devices as far as the surface region of the first passivation region and, thus, form a corresponding contact with the underlying CMOS structure, are formed in the first cutouts in the first passivation region. Here, the first and second contact regions or plug regions formed can be substantially of identical construction, in particular, with respect to the geometric properties and material properties thereof.

If appropriate, the corresponding capacitor devices and, in particular, the individual capacitors with their individual electrodes can then be formed.

Here, at least one second material region for first electrodes of the first electrode device is formed and/or deposited, in particular, on the surface region of the first passivation region with the contact regions or plug regions formed therein. Here, in particular, at least one electrically conductive material is used, for example a metal, a metal oxide and/or the like. In addition, the second material region is formed, in particular, in a two-dimensional, conformal fashion that covers a large area and/or the entire area.

A third material region for first dielectric regions of the dielectric is then immediately deposited.

Here, in particular, a ferroelectric, paraelectric or the like is used. This deposition process also takes place in a two-dimensional, conformal fashion that covers a large area and/or the entire area, in particular, a planar surface being also provided for the third material region, in particular, on the surface region of the second material region for the first electrodes of the first electrode device.

In accordance with an additional mode of the invention, at least the second material region for the first electrodes of the first electrode device is patterned, in particular, by an anisotropic etching process and/or, in particular, with cutouts in the region of the second defined locations. As a result, pairs of connected first electrodes, electrically insulated from one another and from the second contact regions or plug regions, of the first electrode device are advantageously formed in substantially electrically common contact in each case with the first contact regions or plug regions. Moreover, there may be provision that the second and the third material regions, namely the material regions for the first electrodes of the first electrode device and for the first dielectric regions of the dielectric, are formed and/or patterned substantially together, in particular, in a common and/or cascaded process sequence. This procedure allows corresponding multiple lithography steps to be simplified and/or eliminated.

To protect and stabilize the structure that is formed as such, in accordance with yet another mode of the invention, a second passivation region of a substantially electrically insulating material is formed and/or deposited. This takes place in a two-dimensional, conformal fashion over a large area and/or over the entire area, in particular, surface regions of the second contact regions or plug regions, of the first dielectric regions of the dielectric, of the first electrodes of the first electrode devices and/or of the first passivation region or parts thereof being substantially embedded and/or covered, specifically, in particular, as far as the level of the surface regions of the first dielectric regions, if appropriate by subsequent polishing with a stop at the level of the surface regions of the first dielectric regions.

To open and later make contact with the second contact regions or plug regions, in accordance with yet a further mode of the invention, second cutouts are formed in the defined second regions or locations, in particular, by selective etching back or the like. Here, material of the second passivation region is advantageously removed as far as the level of the surface regions of the second contact or plug regions such that surface regions of the second contact regions or plug regions are at least partially exposed.

Then, if appropriate a fourth material region for first electrodes of the second electrode devices is formed and/or deposited. This is carried out, in particular, using at least one electrically conductive material, for example a metal, metal oxide and/or the like and, in particular, in a two-dimensional, conformal fashion over a large area and/or the entire area, in which case, furthermore, in particular, a substantially planar surface region is formed.

Then, this fourth material region is structured, and the first electrodes of the second electrode device are formed, specifically, in particular, by an anisotropic etching process and/or by forming cutouts in the region of the first defined locations in the fourth material region. As a result, pairs of first electrodes, connected to one another, of the second electrode devices, the pairs being substantially electrically insulated from one another and from the first contact regions or plug regions, are formed in substantially common electrical contact in each case with the second contact regions or plug regions.

Specifically, additional separate first and second electrodes for the further individual capacitors can then be formed. However, it is of particular advantage if the alternating sequence of electrodes of the first and second electrode devices and intermediate layering of corresponding dielectric regions forms a stack structure of individual capacitors. Here, as has already been described, the respective electrodes of the electrode devices can each fulfill a double function.

In accordance with yet an added mode of the invention, a fifth material region for second dielectric regions of the dielectric is formed and/or deposited, in particular, in the form of a ferroelectric, paraelectric or the like, in particular, in a two-dimensional, conformal fashion over a large area and/or over the entire area, and/or, in particular, with a substantially planar surface region, if appropriate, in particular, is deposited directly on the surface region of the fourth material region for the first electrodes of the second electrode devices.

A third passivation region of a substantially electrically insulating material is then deposited and/or formed. This is carried out again, in particular, in a two-dimensional, conformal fashion over a large area and/or over the entire area, in particular, surface regions of the first electrodes of the second electrode devices, of the second dielectric regions of the dielectric and/or of the second passivation region or parts thereof being substantially embedded and/or covered. This is carried out, in particular, as far as the level of the surface regions of the second dielectric regions of the dielectric, if appropriate, by subsequent polishing with a stop at the level of the surface regions of the second dielectric regions of the dielectric.

Third cutouts are then formed at the defined first regions or defined first locations, in particular, by selecting etching back or the like. Here, the material of the third passivation region is removed, in particular, as far as the level of the surface regions of the first electrodes of the first electrode devices, such that the surface region of the first electrodes of the first electrode devices is at least partially exposed, and/or that in the process spacer elements or the like are left or formed in adjacent peripheral regions or edge regions of the first electrodes of the second electrode devices to electrically insulate the first electrodes of the first electrode devices.

The third cutouts are formed here vertically at least partially as far as the level of the surface regions of the first electrodes of the first electrode devices.

A sixth material region of a substantially electrically conductive material is then formed and/or deposited, in particular, in a two-dimensional, conformal fashion over a large area and/or over the entire area, in particular, the third cutouts being each filled as far as the level of the surface regions of the first electrodes of the first electrode devices, and/or in particular, if appropriate, being planarized as far as the level of the surface regions of the second dielectric regions of the dielectric and/or of the third passivation region. This takes place in order to form the intermediate plug regions as it were as an extension of the first plug regions, in particular, contact being formed with the individual electrodes of the first electrode device.

A seventh material region for second electrodes of the first electrode devices is then formed and/or deposited, in particular, from at least one electrically conductive material, for example, a metal, metal oxide, and/or the like and/or, in particular, in a two-dimensional, conformal fashion over a large area and/or over the entire area, in particular, a substantially planar surface being provided again.

This seventh material region for the second electrodes of the first electrode device is patterned, in particular, by an anisotropic etching process and/or by forming corresponding cutouts in the region of the second locations, in order to provide pairs of second electrodes of the first electrode device that are electrically connected to one another, the pairs being substantially electrically insulated from one another and from the second contact regions or plug regions and being each substantially in common electrical contact with the intermediate plug region and correspondingly with the first electrodes of the first electrode devices and in the first plug region.

Finally, if appropriate a fourth passivation region and further contact-forming layers are then formed, the fourth passivation region being formed and/or deposited from a substantially electrically insulating material, in particular, in a two-dimensional, conformal fashion over a large area and/or over the entire area, in particular, surface regions of the third passivation region and/or of the second electrodes of the first electrode device or parts thereof being substantially embedded and/or covered, specifically, in particular, with a planar surface region for the fourth passivation region.

The invention will be explained further by way of example in the following remarks.

In FeRAM memories, the information is formed and stored by polarization of the dielectric, that is to say, of the ferroelectric or paraelectric material between the individual electrodes in the capacitor devices or capacitors. To change or switch over the polarization, and, thus, the information, a certain minimum voltage, referred to as the coercitive voltage $V_c$, must be provided and applied to the capacitor. The value of the coercitive voltaghe $V_c$ is determined by the properties of the dielectric used and by its layer thickness. By suitably selecting the coercitive voltages, a plurality of ferroelectric capacitors can be switched for each capacitor device for a single selector transistor. It is then possible to read information items in and out independently of one another in each individual capacitor of the capacitor devices. As a result, the area required for the individual capacitor devices for each selector transistor, in particular, in the case of FeRAM memories, is reduced so that there is a resulting increase in the integration density of corresponding semiconductor memory devices as a result of the corresponding selection of the coercitive voltages $V_c$ and the saving in area that is, thus, made possible.

The basic idea of the present invention is to make possible the idea of forming a plurality of capacitors or individual capacitors for the capacitor devices per selector transistor to increase the storage density and integration density in FeRAM configurations, in particular, with a chain structure.

Accordingly, with the proposed configuration, for example, a multiplicity of ferro-capacitors with different coercitive voltages $V_c$ are connected in parallel to one selector transistor each, the multiplicity of these different ferro-capacitors forming a respective capacitor device. The different coercitive voltages $V_c$ can be achieved by using different layer thicknesses for the respective dielectrics and/or by varying the dielectric materials. By virtue of the different coercitive voltages, it is then possible to write to the individual capacitors of the capacitor devices, and read them out again, in series and/or in parallel.

The basis of the manufacturing methods of such semiconductor memory devices is the basic structure in which an intermediate oxide is deposited as the passivation region over the CMOS structure in the region of the semiconductor substrate and then, if appropriate, planarized by CMP. What are referred to as the plugs or plug regions are then etched into the intermediate oxide in the form of cutouts and then formed on the intermediate oxide by, for example, polysilicon with a planar surface, both the plugs for the bottom electrodes and plugs for the top electrodes being substantially formed simultaneously or in a common process step.

A first sequence for a manufacturing method is described in the following text.

Firstly, first bottom electrodes are deposited and patterned, if appropriate, with an oxygen barrier, the oxygen barrier being composed of, for example, Ti/Ir/IrOx/Pt. A first dielectric layer in the form of a ferroelectric is then deposited, patterned, and heat-treated.

As an alternative to the processes described, it is possible at first to dispense with the patterning of the first bottom electrode stack. Then, once the first dielectric has been deposited and heat-treated, the ferroelectric can then firstly be etched in a multi-step etching process, and, then, the first bottom electrode, from bottom to top. Such a process has the advantage that the ferroelectric that is to be subsequently deposited looks like a material layer that is exclusively unpatterned, that is to say, covers a large area or the entire area, made of platinum, for example. This means that when the ferroelectric is heat treated, the entire electrode stack of the first bottom electrode is still coherent. It has been found here that oxidation of the underlying plug regions, made, for example, of polysilicon, can be prevented in a significantly improved way by a coherent, i.e., unpatterned, oxygen barrier layer system.

After the patterning of the first bottom electrode with the ferroelectric on top of it, a further passivation region is deposited and etched back in the form of an oxide layer with a stop at the first dielectric region. An annealing step in an oxygen-containing atmosphere may possibly then have to be carried out to repair the damage that could occur during the polishing and etching, in particular, in the ferroelectric. Then, windows are opened through the oxide to the second plug regions that are to be later connected to the top electrodes.

The deposition of the material for the second electrode, specifically the first top electrode, takes place, using, in particular, Pt, SrRuOx, RuOx, IrOx, or the like, as part of a PVD or CVD method.

This is then followed by the deposition, patterning, and heat-treatment of the second dielectric in the form of a ferroelectric and, then, the patterning of the first top electrode, that is to say, the second electrode.

Then, a passivation layer, for example, in the form of an oxide, with a stop at the second dielectric is deposited and etched back, and an annealing step in an oxygen-containing atmosphere may possibly be necessary again. Windows that lead to the first electrode or first bottom electrode are then opened in the oxide. This is then followed by deposition and patterning of a third electrode or further top electrode, corresponding contact being made with the first electrode or first bottom electrode by forming an intermediate plug region. The deposition and planarization of an embedding dielectric intermediate layer (ILD: Inter Layer Dielectric) takes place finally.

A second process sequence uses substantially a CMP method and substantially includes the following steps:

Deposition and patterning of the first electrode or bottom electrode as a stack with oxygen barrier;

Deposition and patterning of an oxide as an insulating or passivation region;

Deposition, if appropriate, planarization and heat treatment of a first ferroelectric. Then opening of windows through the oxide to plug regions made of polysilicon;

Deposition and, if appropriate, planarization of the second electrode or first top electrode;

Patterning of the second electrode;

Deposition and patterning (if appropriate, opening of window regions) of an oxide as a further passivation region;

Deposition, planarization, and heat treatment of a second dielectric region in the form of a ferroelectric;

Opening of windows through the oxide to the first electrode or bottom electrode;

Deposition of a third electrode or top electrode, it being possible to carry out the patterning using conventional etching techniques or else by CMP; and Deposition and planarization of an ILD.

The fundamental idea of the present invention is, inter alia, the connection in parallel of a plurality of capacitors for each capacitor device as a storage element, in particular, in conjunction with what is referred to as the connected or chain FeRAM configuration, in which case, in particular, operation with different coercitive voltages $V_c$ for the different individual capacitors of the respective capacitor devices is also implemented.

Other features that are considered as characteristic for the invention are set forth in the appended claims.

Although the invention is illustrated and described herein as embodied in a FeRAM memory and method for manufacturing it, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Referring now to the figures of the drawings in detail and first, particularly to FIGS. 1 to 11 thereof, there is shown intermediate steps for manufacturing a semiconductor memory device by an embodiment of the method according to the invention. Identical or identically acting elements are designated by identical reference symbols and their description is not repeated in detail for each figure individually.

Figure 1:
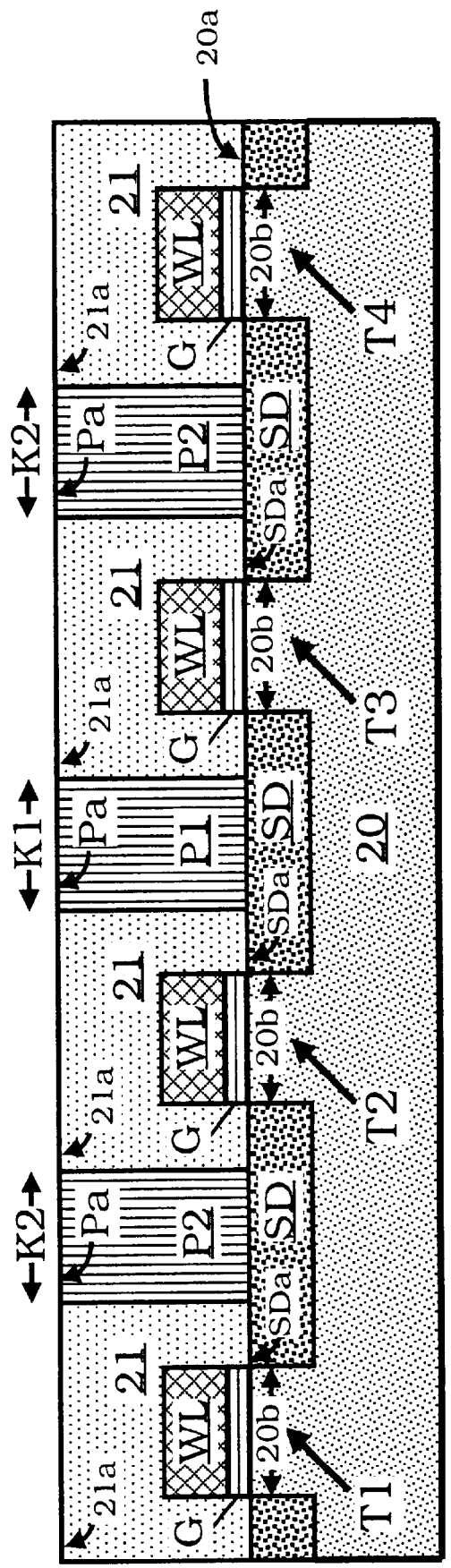
FIGS. 1 to 12 are fragmentary, cross-sectional views of intermediate steps occurring for manufacturing a semiconductor memory device according to the invention.

The starting point of the embodiment shown in FIGS. 1 to 12 of the manufacturing method according to the invention for a semiconductor memory device is the configuration shown in a lateral cross-sectional view in FIG. 1.

In an actual semiconductor substrate 20, a CMOS structure that is used to wire the semiconductor device 1 is formed in a prior process. In a surface region 20a of the semiconductor substrate 20, selector transistor devices T1 to T4 are provided for selecting the memory cells to be formed, i.e., for driving the corresponding memory capacitors 10-1, . . . , 10-4, which are to be formed. See FIG. 12. The selector transistors T1 to T4 are formed by source/drain regions SD disposed on the surface region 20a of the semiconductor substrate 20. Here, adjacent source/drain regions SD are disposed spaced apart from one another and spatially separated from one another by an intermediate region 20b in the surface region 20a of the semiconductor substrate 20. Substantially electrically conductive word lines WL that are electrically insulated by gate oxide regions G run above the intermediate regions 20b in the surface region 20a of the semiconductor substrate 20.

The gate oxide regions G, which, thus, function as a gate, of the individual selector transistor devices T1 to T4 are driven by the word lines WL. What are referred to as first and second contact regions, plug regions or plugs P1 and P2 composed of substantially electrically conductive material are provided above the source/drain regions SD, i.e., extending from the surface region 20a at predefined locations K1 and K2, respectively. The first and second plugs P1 and P2 are in substantially electrically conductive contact with the source/drain regions SD, specifically, through their surface region SDa. The word lines WL, the gate oxide regions G, and the first and second plugs P1 and P2 are embedded in a passivation region 21 that is formed, for example, from a silicon oxide. The surface region 21a of the passivation region 21 is located opposite the surface region 20a of the actual semiconductor substrate 20. Thus, the first and second plugs P1 and P2 extend from the surface region 20a, specifically in electrically conductive contact with the source/drain regions SD through their surface regions SDa, with their own surface region Pa as far as the surface region 21a of the first passivation region 21.

Figure 2:
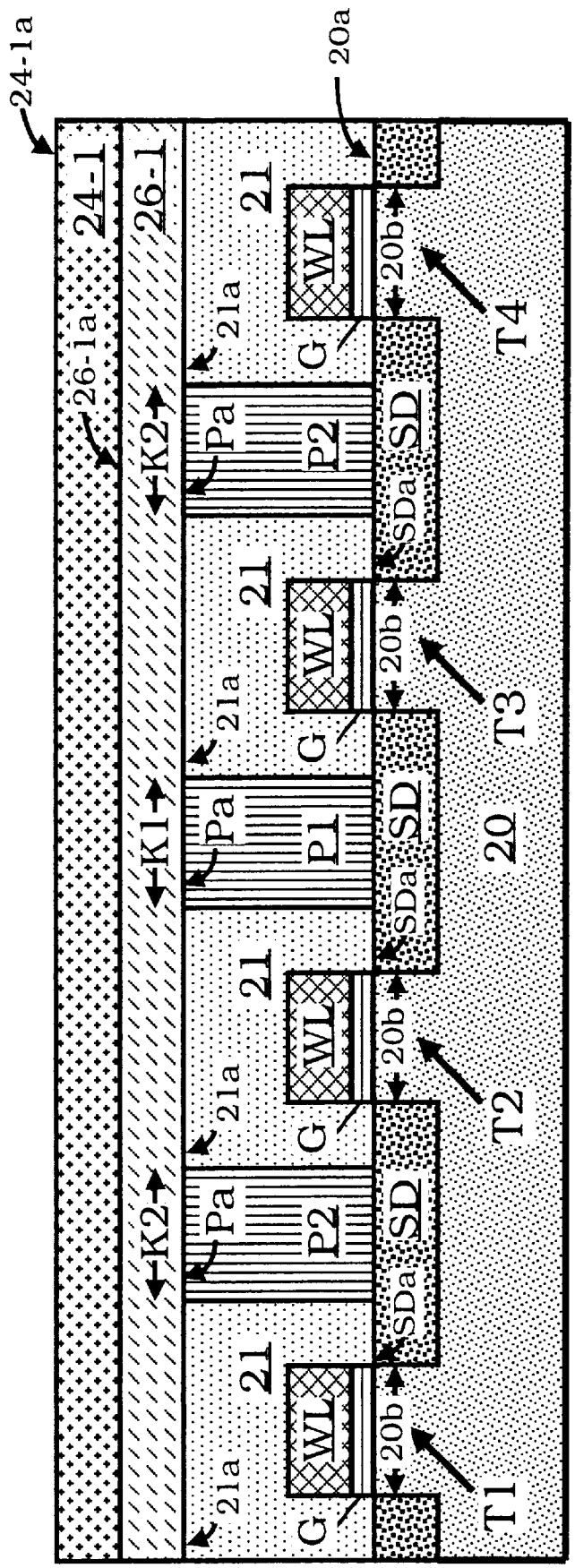

At the transition from the initial state shown in FIG. 1 to the intermediate state shown in FIG. 2, material regions 26-1 and 24-1 for first electrodes 14-1 (see FIG. 3) of the first electrode device 14 and for first dielectric regions 16-1 of the dielectric 16 are deposited as part of a two-dimensional deposition method over the entire surface.

Figure 3:
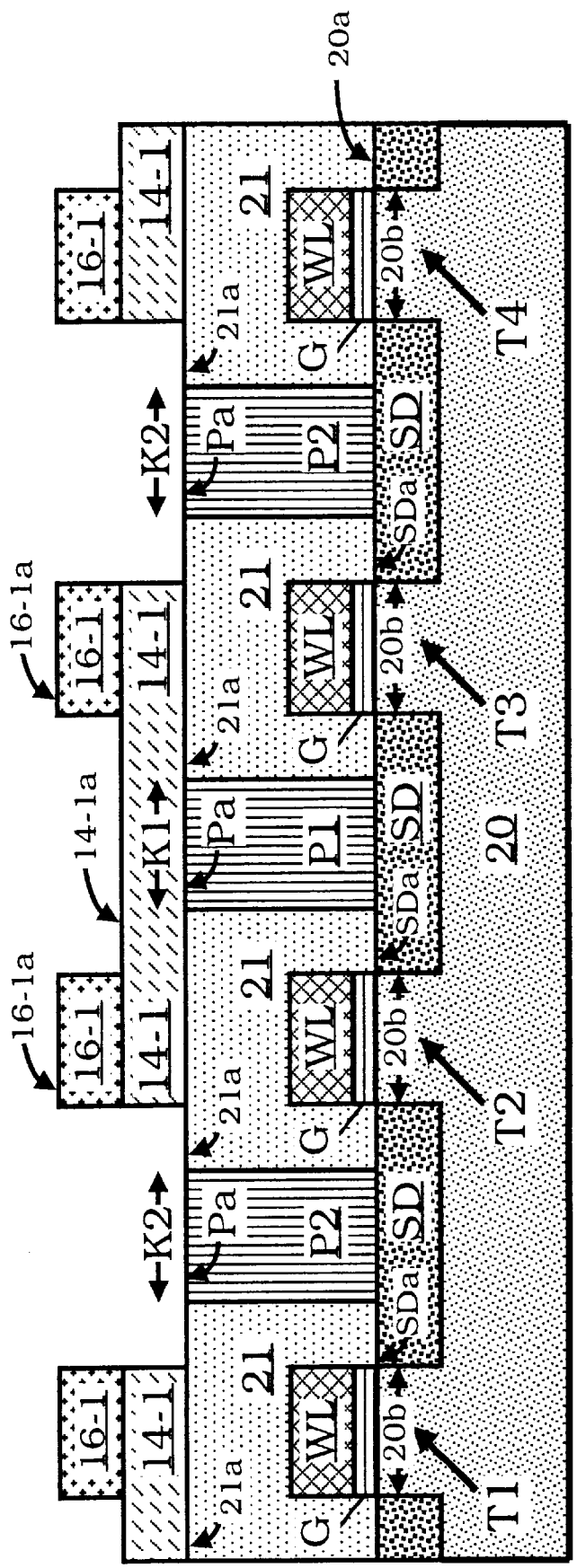

At the transition in the intermediate state shown in FIG. 3, the first electrodes 14-1 of the first electrode devices 14 and the first dielectric regions 16-1 of the dielectric 16 are correspondingly patterned as part of a multistage etching process.

Figure 4:
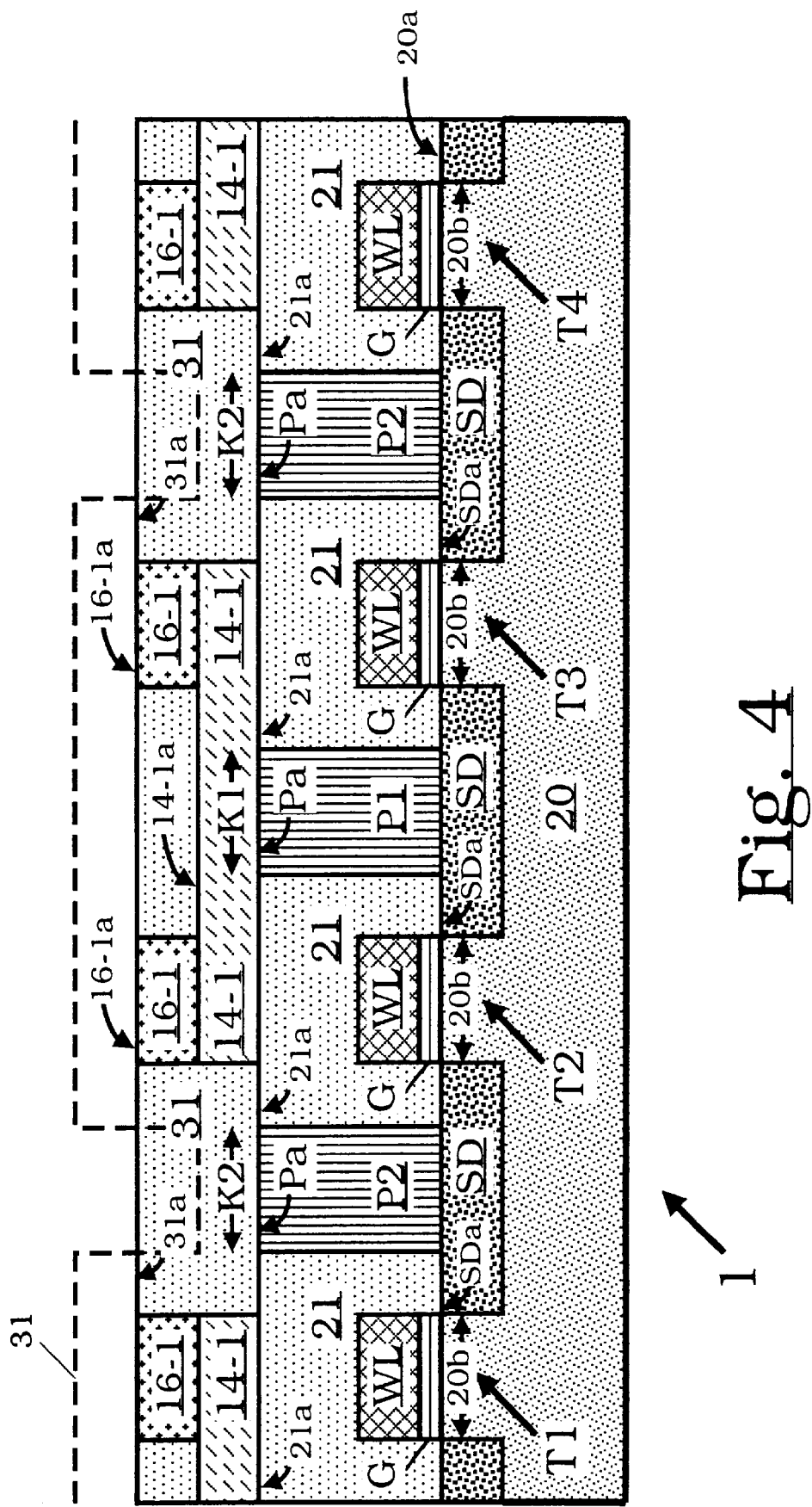
Figure 5:
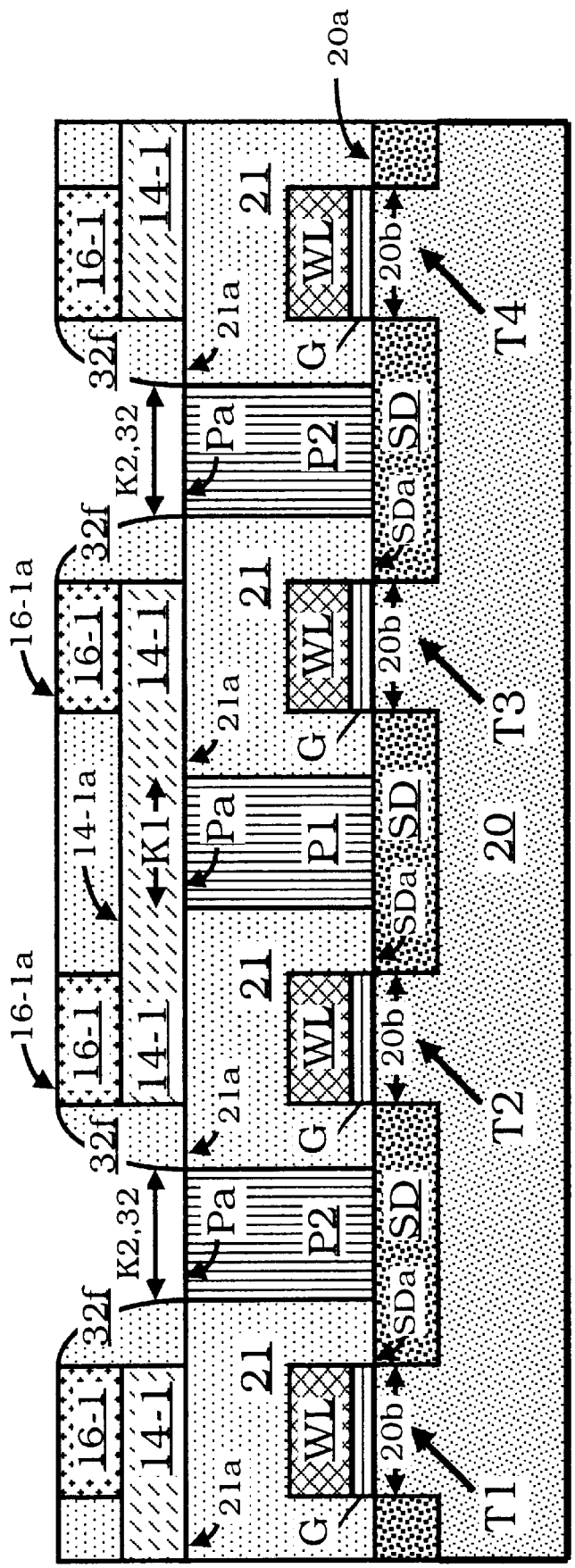

The configuration that is so obtained is then embedded in a second passivation region 31, in particular, if appropriate, in a conformal fashion (represented by dashed lines), as is shown in FIG. 4, and then patterned by anisotropic etching back to open the second passivation region 31 to the surface regions Pa of the second plug regions P2 and in the region of the defined locations K2 by cutouts 32, as shown in FIG. 5.

Figure 6:
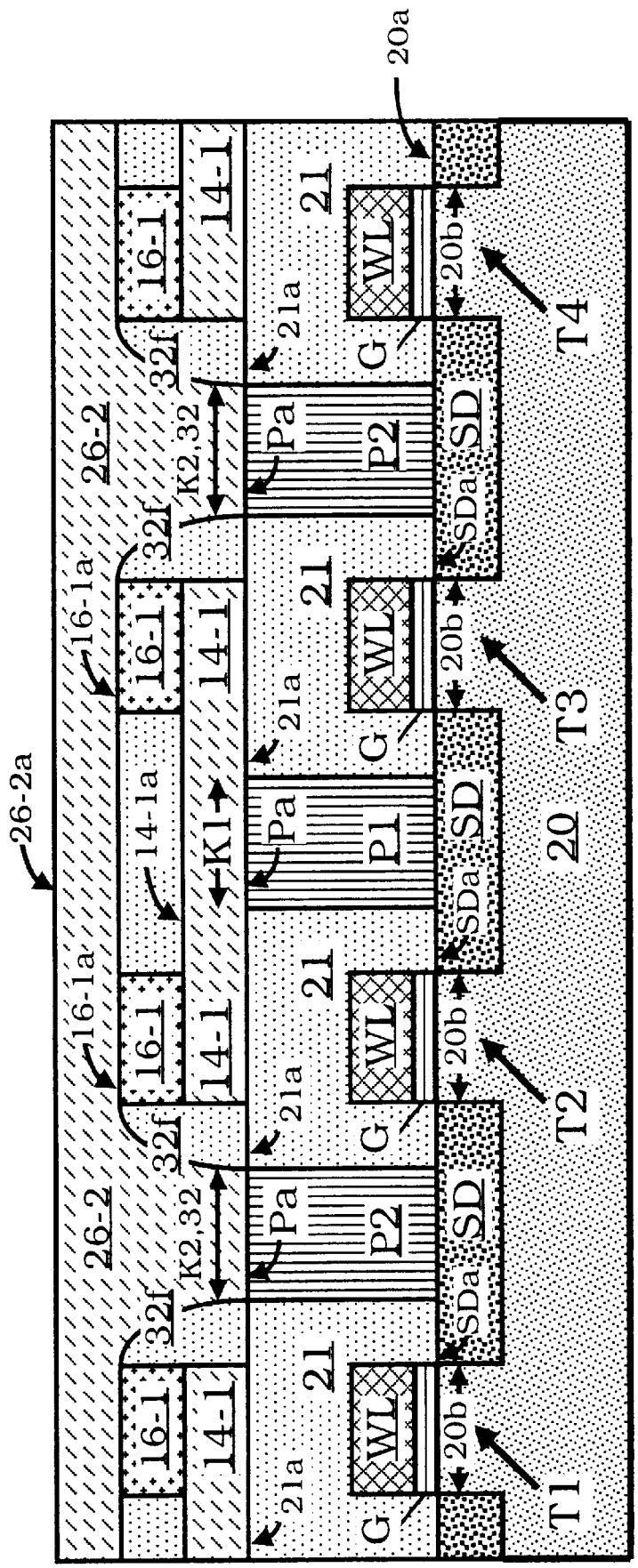

At the transition to the intermediate state shown in FIG. 6, a further material layer 26-2 for the first electrodes 18-1 of the second electrode devices 18 is deposited in a conformal fashion over the entire surface so that the surface regions 31a, 21a, Pa, 16-1a of the first passivation region 21, of the second passivation region 31, of the second plug regions P2 and of the first dielectric regions 16-1 are covered and embedded.

Figure 7:
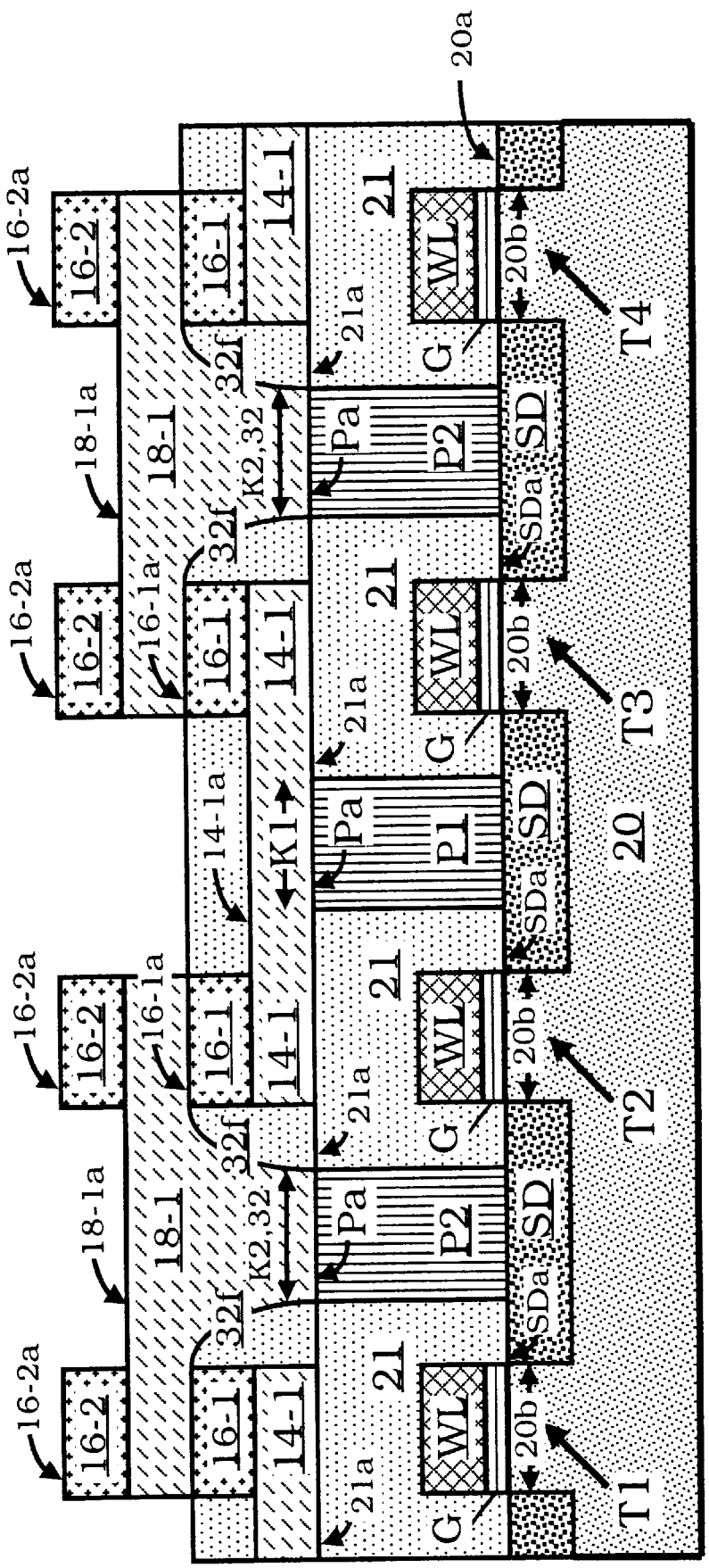

At the transition to the state shown in FIG. 7, a material layer is deposited for second dielectric regions 16-2 and correspondingly patterned to form the second dielectric regions 16-2 such that the first dielectric regions 16-1 and second dielectric regions 16-2 lie one on top of the other substantially congruent and flush in the vertical direction and separated from one another by the material region 26-2. Furthermore, by a corresponding further etching back process, the material region 26-2 is electrically divided into regions of the first defined locations K2 by corresponding cutouts in pairs that are separate from one another with first electrodes 18-1, connected to one another, of the second electrode device 18.

Figure 8:
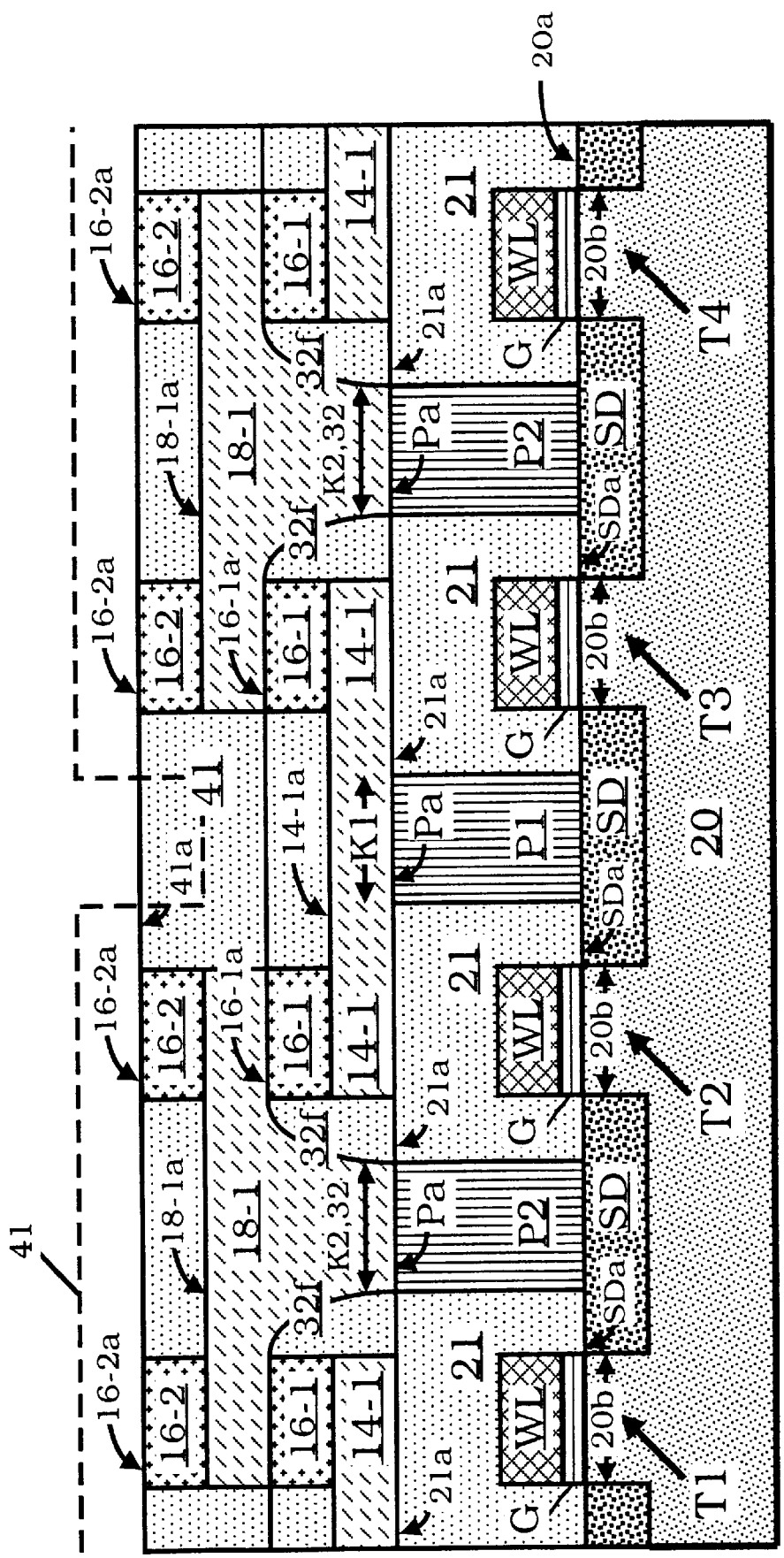

At the transition to the intermediate state shown in FIG. 8, the configuration in FIG. 7 is embedded in a further passivation region 41, specifically, in particular, if appropriate, in a conformal fashion (represented by dashed lines), a surface 41a that is planar in certain areas being formed so as to finish flush with the level of the surface regions 16-2a of the second dielectric regions 16-2.

Figure 9:
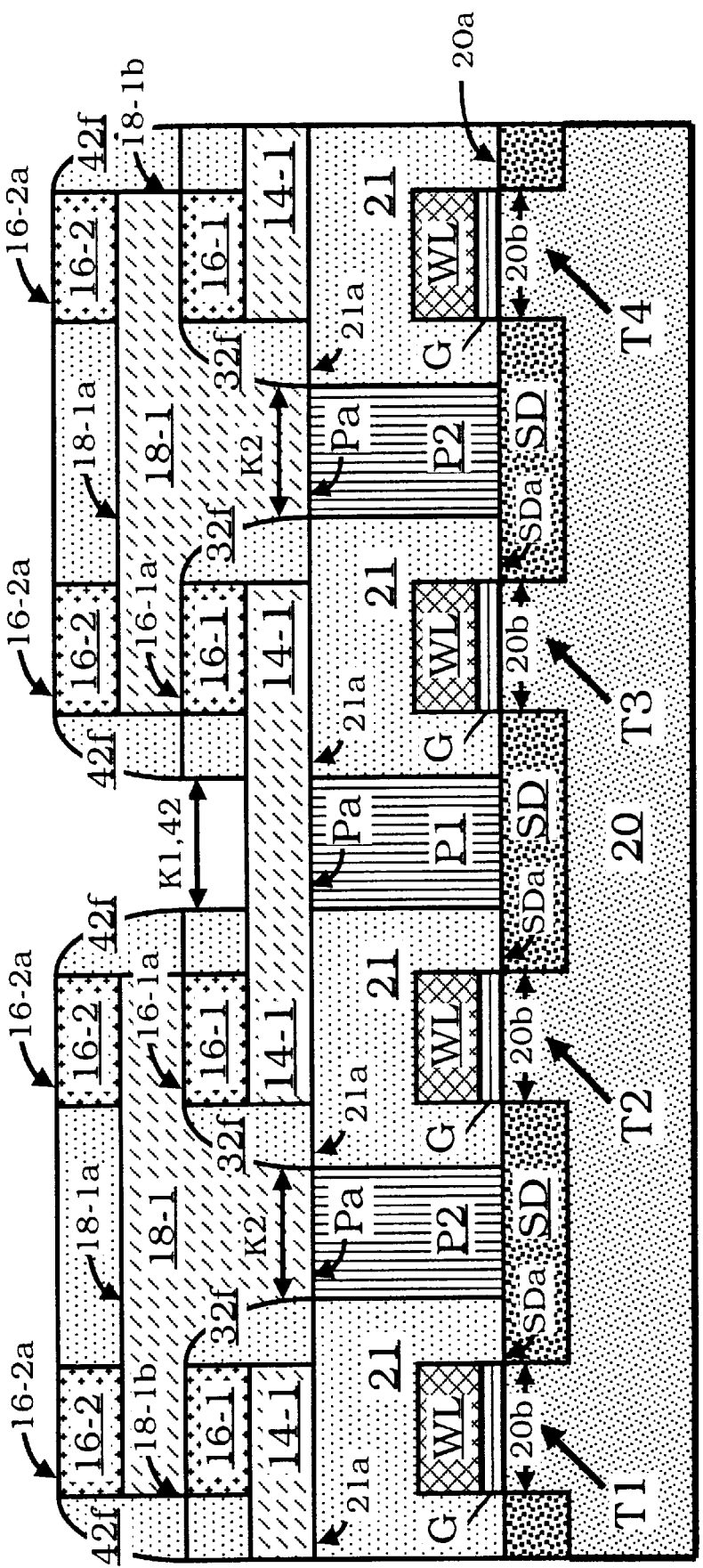

Then, in an anisotropic etching back process in the region of the defined first locations K1, the passivation region 41 is opened by cutouts 42 as far as the surface region 14-1a of the first electrodes 14-1 of the first electrode devices 14, in particular, spacer elements 42f being left that are made of electrically insulating material and that are used for insulating edge regions or peripheral regions 18-1b of the first electrodes 18-1 of the second electrode devices 18 from the first electrodes 14-1 of the first electrode device 14 and from the first plug regions P1. This intermediate state is shown in FIG. 9.

Figure 10:
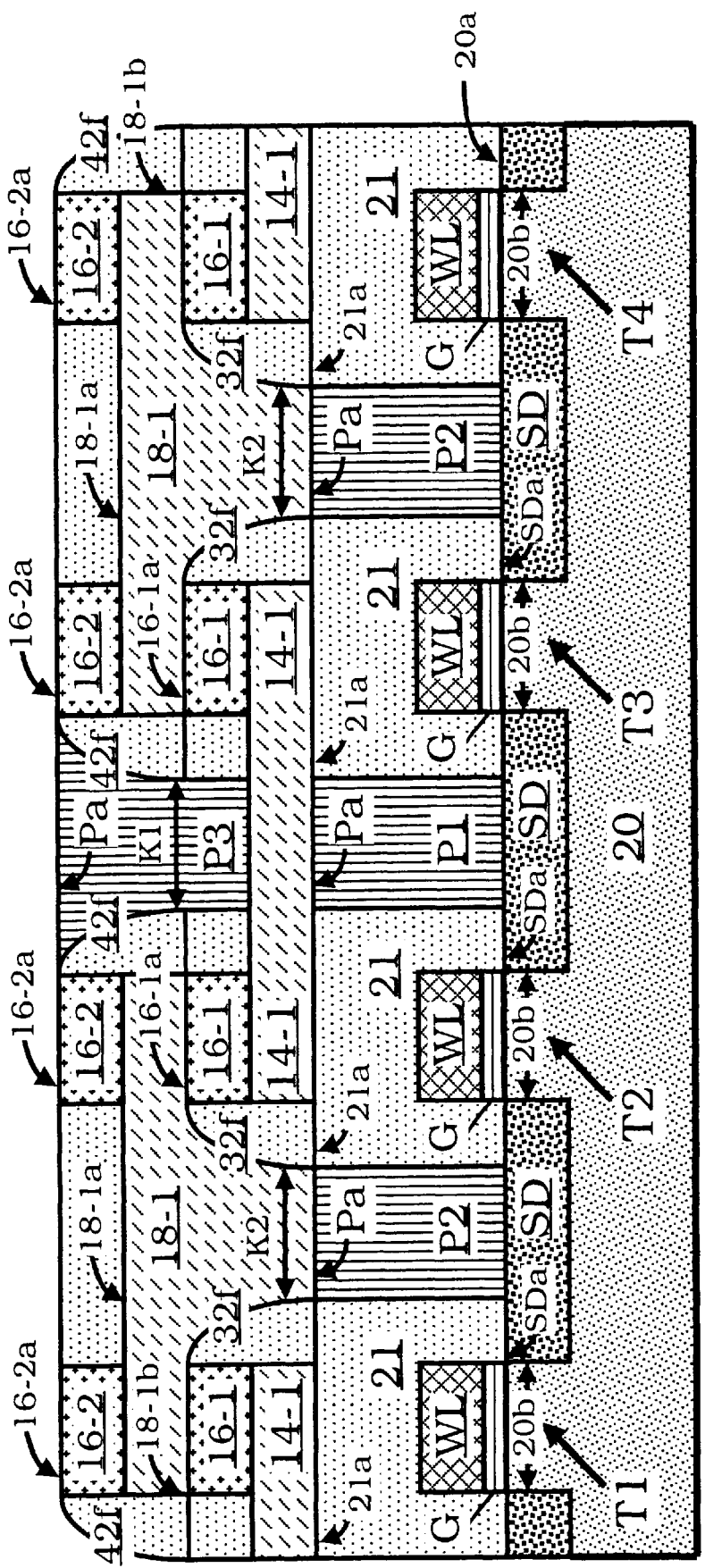

At the junction with FIG. 10, the cutouts 42 are filled with an electrically conductive material to form intermediate plug regions P3 that are used for making contact later between the first and second electrodes 14-1 and 14-2 of the first electrode devices 14 with one another and with the first plug region P1.

Figure 11:
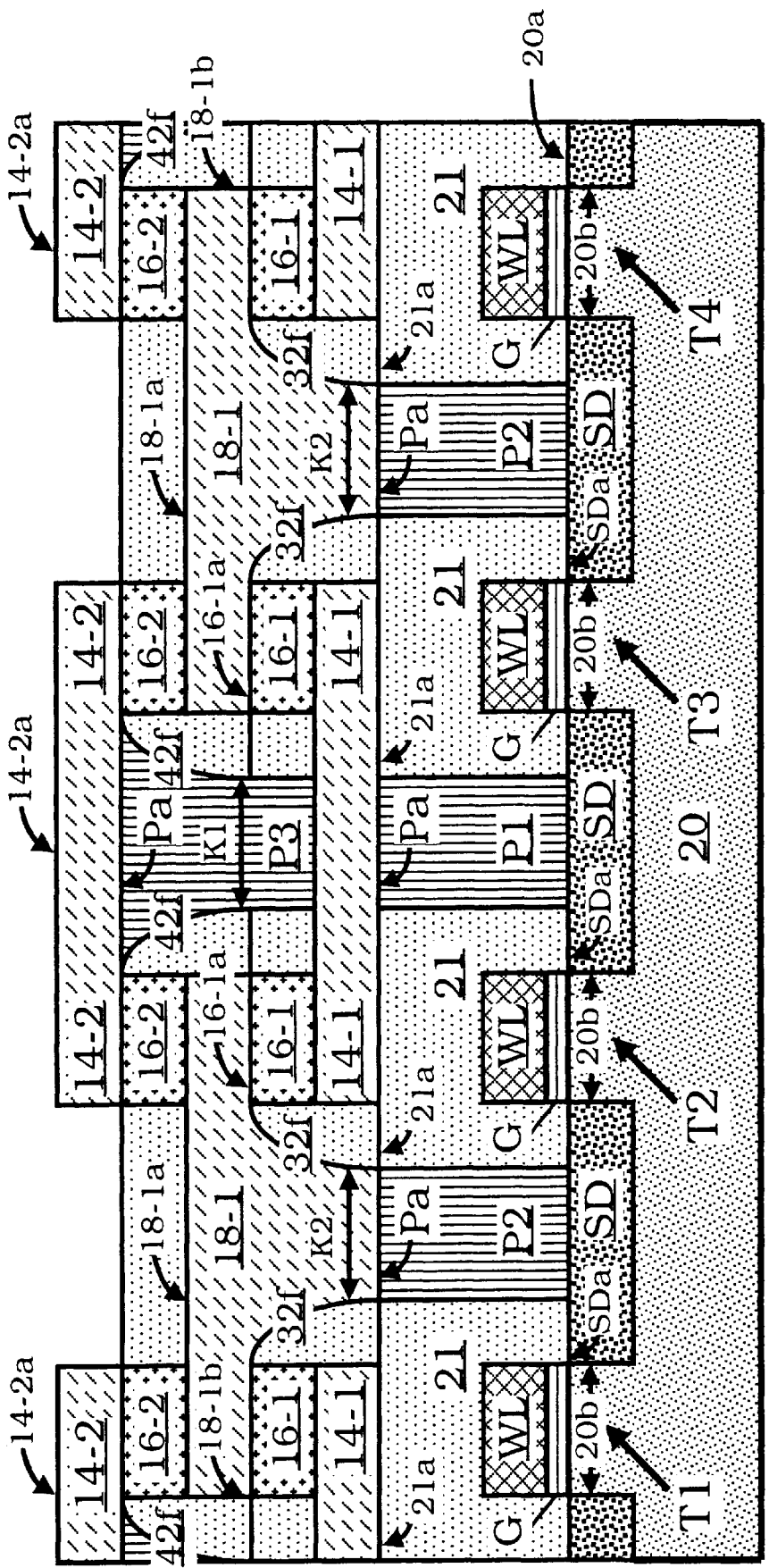

Then, at the transition to the intermediate state in FIG. 11, a material layer is formed for the second electrodes 14-2 of the first electrode device 14 with a planar surface region, pairs of second electrodes 14-2, connected to one another, of the first electrode device 14 being then formed, the pairs being separated from one another by appropriate patterning and the electrodes 14-2 being also electrically connected to the first electrodes 14-1 of the first electrode device 14 and to the first plug region P1 through the intermediate plug region P3.

Figure 12:
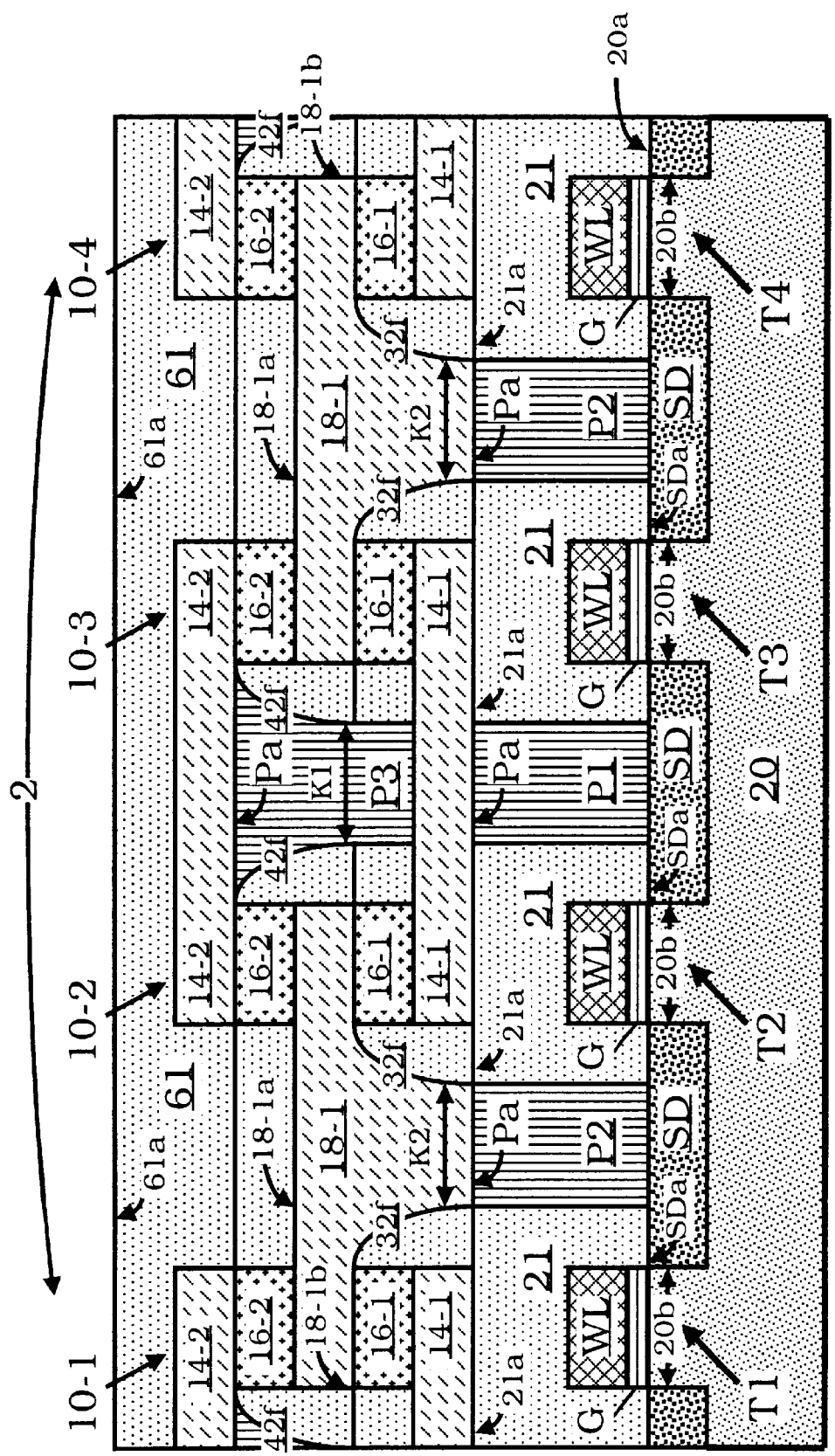

At the transition to the state in FIG. 12, the protective and embedding further passivation region 61 with a planar surface 61a is then finally formed.

We claim:

1. A FeRAM memory, comprising:
   at least one of a semiconductor substrate, a passivation region and a surface region formed with a CMOS structure; and
   a capacitor configuration having a multiplicity of capacitor devices used as storage elements disposed in a region of said at least one of said semiconductor substrate, said passivation region, and said surface region, at least some of said capacitor devices being formed with a multiplicity of individual capacitors connected in parallel with one another, said individual capacitors having one of ferroelectric and paraelectric dielectric regions with different coercitive voltages to provide each of said capacitor devices with a multiplicity of storage states.

2. The FeRAM memory according to claim 1, wherein each of said capacitor devices has a first electrode device, a second electrode device, and a dielectric disposed between said first electrode device and said second electrode device.

3. The FeRAM memory according to claim 2, wherein at least some of said first and second electrode devices have electrodes respectively electrically connected to one another to thereby form said multiplicity of individual capacitors connected in parallel with one another.

4. The FeRAM memory according to claim 3, wherein at least some of said electrodes connected to one another are identified with one another as at least one of:
   an electrically conductive one-part region; and
   an electrically conductive one-piece region.

5. The FeRAM memory according to claim 3, wherein at least some of said capacitor devices have a first contact element and second contact element and are in contact:
   with a first electrode device of a first directly spatially adjacent one of said capacitor devices by a respective one of said first electrode devices through said first contact element; and
   with a second electrode device of a second directly spatially adjacent one of said capacitor devices by a respective one of said second electrode devices through said second contact element,
   to form a capacitor configuration having at least one of a partially connected structure and a chain structure.

6. The FeRAM memory according to claim 1, wherein at least some of said capacitor devices are in a stack structure.

7. A method for manufacturing a FeRAM memory, which comprises:
   forming at least one of a semiconductor substrate, a passivation region, and a surface region with a CMOS structure; and
   forming a capacitor configuration of a multiplicity of capacitor devices used as storage elements in a region of the at least one of the semiconductor substrate, the passivation region, and the surface region, at least some of the capacitor devices being formed with a multiplicity of individual capacitors connected in parallel with one another, the individual capacitors being formed with one of ferroelectric and paraelectric dielectric regions with different coercitive voltages, and, as a result, each capacitor device is formed with a multiplicity of storage states.

8. The method according to claim 7, which further comprises providing, for each of the capacitor devices, a first electrode device, a second electrode device, and a dielectric formed between the first electrode device and the second electrode device.

9. The method according to claim 8, which further comprises forming at least some of the first and second electrode devices with a multiplicity of electrodes respectively electrically connected to one another, and, as a result, forming the multiplicity of individual capacitors connected in parallel with one another.

10. The method according to claim 9, which further comprises identifying at least some of the respective multiplicity of electrodes connected to one another as at least one of an electrically conductive one-part region and an electrically conductive one-piece region.

11. The method according to claim 9, which further comprises forming a capacitor configuration with at least one of a partially connected structure and a chain structure by:
    connecting a respective first electrode device of at least some of the capacitor devices to a first electrode device of a first directly spatially adjacent one of the capacitor devices through a first contact element; and
    connecting a respective second electrode device to a second electrode device of a second directly spatially adjacent one of the capacitor devices through a second contact element.

12. The method according to claim 7, which further comprises configuring at least some of the capacitor devices in a stack structure.

13. The method according to claim 7, which further comprises one of at least partially covering and at least partially embedding, in a two-dimensional method covering at least a substantial area of one of the semiconductor substrate and the surface region, the CMOS structure and one of a horizontally extending semiconductor substrate and the surface region with at least a first upper and laterally extending passivation region of an electrically insulating material, said first upper and laterally extending passivation region having a planar surface region.

14. The method according to claim 13, which further comprises forming, with a common and selective etching process, first cutouts in defined first and second locations in the first upper passivation region.

15. The method according to claim 14, which further comprises:
    providing selector transistor devices of the CMOS structure above source/drain regions in surface regions of the semiconductor substrate; and
    selecting the selector transistor devices as the defined first and second locations.

16. The method according to claim 15, which further comprises vertically forming the first cutouts at least to a given extent as far as a level of surface regions of the source/drain regions of the selector transmitter devices.

17. The method according to claim 16, which further comprises forming a first material region of an electrically conductive material on a surface region of the first passivation region by two-dimensional deposition in a conformal form covering substantially all of the area and filling the respective first cutout as far as the level of the surface region of the source/drain regions and subsequently polishing to a level of the surface region of the first passivation region.

18. The method according to claim 16, which further comprises forming a first material region of an electrically conductive material on a surface region of the first passivation region by two-dimensional deposition in a conformal form covering a given area and filling the respective first cutout as far as the level of the surface region of the source/drain regions and subsequently polishing to a level of the surface region of the first passivation region.

19. The method according to claim 17, which further comprises depositing at least a second material region for first electrodes for the first electrode devices from at least one of the group consisting of an electrically conductive material, a metal, and a metal oxide in a two-dimensional, conformal fashion over a given area with a planar surface region to form first and second plug regions making contact with the capacitor devices and the CMOS structure.

20. The method according to claim 19, which further comprises constructing the first and second plug regions identically.

21. The method according to claim 20, which further comprises depositing a third material region for first dielectric regions of the dielectric in a form of one of the group consisting of a ferroelectric and a paraelectric in a two-dimensional, conformal fashion over a given area with planar surface regions on a surface region of the second material region.

22. The method according to claim 19, which further comprises structuring at least the second material region for the first electrodes of the first electrode device by an anisotropic etching process and with cutouts in the region of the second defined locations, and, as a result, forming pairs of connected first electrodes, electrically insulated from one another and from the second plug regions, of the first electrode devices in respective common electrical contact with the first plug regions.

23. The method according to claim 21, which further comprises one of forming and patterning the second and the third material regions together in a sequence selected from the group consisting of a common process sequence and a cascaded process sequence.

24. The method according to claim 23, which further comprises forming a second passivation region of an electrically insulating material in a two-dimensional, conformal fashion over a given area, surface regions of at least one region selected from the group consisting of the second plug regions, the first dielectric regions, the first electrodes, the first electrode device, and the first passivation region and parts of the at least one region being one of embedded and covered as far as a level of a surface region of the first dielectric region by subsequent polishing with a stop at the level of the surface region of the first dielectric region.

25. The method according to claim 24, which further comprises forming second cutouts at the defined second locations by selective etching back and, in the process, removing material of the second passivation region as far as the level of the surface regions of the second plug regions to respectively expose the surface region of the second plug region.

26. The method according to claim 25, which further comprises depositing a fourth material region for first electrodes of the second electrode device selected from the group consisting of an electrically conductive material, a metal, and a metal oxide in a two-dimensional, conformal fashion over a given area with a planar surface region.

27. The method according to claim 26, which further comprises:
    patterning the fourth material region for the first electrodes of the second electrode devices with an anisotropic etching process and with cutouts in a region of the first defined locations; and
    forming pairs of connected first electrodes, insulated from one another and from the first plug regions, of the second electrode device in respective common electrical contact with the second plug regions.

28. The method according to claim 27, which further comprises depositing a fifth material region for a second dielectric region for the dielectric in the form of one of a ferroelectric and a paraelectric in a two-dimensional, conformal fashion over a given area with a planar surface region on a surface region of the fourth material region.

29. The method according to claim 28, which further comprises forming a third passivation region of a substantially electrically insulating material in a two-dimensional, conformal fashion over a given area, surface regions of at least one region selected from the group consisting of the first electrodes of the second electrode devices, the second dielectric regions of the dielectric, and the second passivation region and parts of the at least one region being one of embedded and covered as far as a level of surface regions of the second dielectric regions of the dielectric by subsequent polishing with a stop at the level of the surface regions of the second dielectric regions of the dielectric.

30. The method according to claim 29, which further comprises forming third cutouts at the defined first locations by selective etching back, and, in the process:
    eroding the material of the third passivation region as far as the level of the surface regions of the first electrodes of the first electrode devices to at least partially expose the surface region of the first electrodes of the first electrode devices; and
    one of leaving and forming spacer elements for electrically insulating the first electrodes of the first electrode devices in adjacent peripheral regions of the first electrodes of the second electrode devices.

31. The method according to claim 30, which further comprises vertically forming the third cutouts at least partially as far as the level of surface regions of the first electrodes of the first electrode device.

32. The method according to claim 31, which further comprises forming a sixth material region of an electrically conductive material in a two-dimensional, conformal fashion to cover a given area and to fill the third cutout respectively as far as the level of the surface regions of the first electrodes of the first electrode devices; and forming intermediate plug regions in substantially electrical contact with the first electrodes of the first electrode devices and with the first plug regions by polishing with a stop at the level of the surface regions of the second dielectric regions of the dielectric.

33. The method according to claim 32, which further comprises one of forming and depositing a seventh material region for second electrodes of the first electrode device from one of the group consisting of an electrically conductive material, a metal, and a metal oxide in a two-dimensional, conformal fashion over a given area with a planar surface region.

34. The method according to claim 33, which further comprises patterning the seventh material region for the second electrodes of the first electrode device with an anisotropic etching process and with cutouts in a region of the second defined locations, and, as a result, forming pairs of connected second electrodes, electrically insulated from one another and from the first electrodes of the second electrode device, of the first electrode device in respective substantially common contact with the extension plug region.

35. The method according to claim 34, which further comprises forming a fourth passivation region of an electrically insulating material in a two-dimensional, conformal fashion over a given area, surface regions of at least one region selected from the group consisting of the second electrodes of the first electrode device and the fourth passivation region being one of embedded and covered with a planar surface region.

36. The method according to claim 7, which further comprises forming the multiplicity of capacitor devices one on top of another.

* * * * *